(12) United States Patent
Chen et al.

(10) Patent No.: US 6,920,796 B2
(45) Date of Patent: Jul. 26, 2005

(54) DEVICE USED FOR DETECTING CLAMPING FORCE OF PROCESSED OBJECT AND METHOD THEREOF

(75) Inventors: Chih-Kun Chen, Tao Yuan Hsien (TW); Yao-Hsiung Kung, Tao Yuan Hsien (TW); Chung-Min Lin, Taipei (TW); Shan-Chang Wang, Tao Yuan Hsien (TW); Jiun-Bo Wang, Taipei Hsien (TW)

(73) Assignee: Nan Ya Technology Corporation, Tao Yuan Hsien (TW)

( * ) Notice: Subject to any disclaimer, the term of this patent is extended or adjusted under 35 U.S.C. 154(b) by 47 days.

(21) Appl. No.: 10/705,939

(22) Filed: Nov. 13, 2003

(65) Prior Publication Data

US 2005/0103121 A1    May 19, 2005

(51) Int. Cl.[7] .............................................. G01N 3/02
(52) U.S. Cl. ..................................................... 73/856
(58) Field of Search ......................... 73/781, 788, 794, 73/804, 819, 855, 856

(56) References Cited

U.S. PATENT DOCUMENTS

| | | | | |
|---|---|---|---|---|
| 4,298,273 A | * | 11/1981 | Nishizuka et al. | ............. 355/61 |
| 5,853,284 A | * | 12/1998 | Ohzeki et al. | .............. 414/757 |
| 5,868,857 A | * | 2/1999 | Moinpour et al. | ............. 134/6 |
| 5,948,173 A | * | 9/1999 | Huh et al. | ..................... 134/34 |
| 6,125,496 A | * | 10/2000 | Stevens, Jr. | .............. 15/230.13 |
| 6,475,293 B1 | * | 11/2002 | Moinpour et al. | ............. 134/6 |

* cited by examiner

*Primary Examiner*—Max Noori
(74) *Attorney, Agent, or Firm*—Browdy and Neimark, P.L.L.C.

(57) ABSTRACT

A device used for detecting the clamping force of a processed object and a method thereof are proposed. The device comprises a detection unit, a basis component and a pressure detection component disposed on the basis component. The basis component having the pressure detection component is closely placed between pivotal rods so that the detection unit can detect variation of electric properties of the pressure detection component to adjust the spacing between the pivotal rods, hence facilitating adjustment of the clamping force.

32 Claims, 8 Drawing Sheets

DEVICE USED FOR DETECTING CLAMPING FORCE OF PROCESSED OBJECT AND METHOD THEREOF

FIELD OF THE INVENTION

The present invention relates to a device used for detecting the clamping force of a processed object and a method thereof, whereby the magnitude of the clamping force can be detected to adjust the spacing between pivotal rods, hence avoiding a too large or too small clamping force between the pivotal rods.

BACKGROUND OF THE INVENTION

FIGS. 1 and 2 show a wafer cleaning apparatus for cleaning the surface of a processed object 10. The processed object 10 is a wafer or another object. The wafer cleaning apparatus utilizes a first pivotal rod set 20 and a second pivotal rod set 30 to clamp the periphery of the processed object 10, and utilizes pivotal rods 21 of the pivotal rod sets 20 and 30 to support and rotate the processed object 10. There are also two cleaning wheels 40, which are respectively moved to upper and lower end faces of the processed object 10 and rotate to clean the processed object 10.

As shown in FIG. 3, during the maintenance of the wafer cleaning apparatus, the spacing between the first pivotal rod set 20 and the second pivotal rod set 30 is adjusted to adjust a force for clamping the processed object 10, and a level 50 is placed at the upper end face of the processed object 10 to determine whether the processed object 10 clamped between the pivotal rod sets 20 and 30 is level.

However, the above conventional apparatus and a method thereof for adjusting the clamping force of a processed object have the following drawbacks.

1. The above conventional device and the method thereof for adjusting the clamping force of a processed object utilize the level 50 as a adjustment tool, and experiences are exploited to determine whether the processed object 10 clamped between the pivotal rod sets 20 and 30 is level, thereby adjusting the force for clamping the processed object 10 between the pivotal rod sets 20 and 30. The force for clamping the processed object 10 between the pivotal rod sets 20 and 30 cannot be obtained in quantitative way. Therefore, the adjustment of the clamping force of the pivotal rods is inconvenient.
2. The above conventional device and the method thereof for adjusting the clamping force of a processed object utilize the level 50 for adjustment of the force for clamping the processed object 10 between the pivotal rod sets 20 and 30. Accumulation and teach-and-learn of experiences are required. The operation cannot be performed with standardized steps or procedures.
3. The above conventional device and the method thereof for adjusting the clamping force of a processed object may easily result in a too small force for clamping the processed object 10 between the pivotal rod sets 20 and 30 due to misjudgment so that the processed object 10 cannot synchronously rotate with the pivotal rod sets 20 and 30, or may easily result in a too large force for clamping the processed object 10 between the pivotal rod sets 20 and 30 so that the processed object 10 will hog. The two cleaning wheels 40 will respectively abut against two sides of the processed object 10, hence easily causing breakage of the processed object 10 and damage of the cleaning equipment.

SUMMARY OF THE INVENTION

One object of the present invention is to provide a device used for detecting the clamping force of a processed object and a method thereof, whereby the clamping force of the processed object can be detected to facilitate adjustment of the spacing between pivotal rods.

Another object of the present invention is to provide a device used for detecting the clamping force of a processed object and a method thereof, whereby the clamping force of the processed object can be detected and displayed when the clamping force of the processed object is being adjusted. Moreover, the clamping force can be quantified.

Another object of the present invention is to provide a device used for detecting the clamping force of a processed object and a method thereof, whereby the clamping force of the processed object can be detected to avoid a too small clamping force, hence letting the processed object synchronously rotate with the pivotal rod.

Another object of the present invention is to provide a device used for detecting the clamping force of a processed object and a method thereof, whereby the clamping force of the processed object can be detected to avoid a too large clamping force, hence preventing breakage of the processed object during the processing process and thus reducing loss of product and damage of equipment.

Another object of the present invention is to provide a device used for detecting the clamping force of a processed object and a method thereof, whereby the step of adjusting the clamping force of the processed object can be easily standardized without the need of teach-and-learn of techniques and experiences.

To achieve the above objects, the present invention provides a device used for detecting the clamping force of a processed object and a method thereof. The device of the present invention detects the clamping force of a processed object tightly clamped by several pivotal rods. The device comprises a basis component, a pressure detection component and a detection unit. The pressure detection component is disposed on the basis component. The detection unit is electrically connected to the pressure detection component to provide electric signal messages. The basis component having the pressure detection component is disposed between the pivotal rods to detect the clamping force.

The method of the present invention detects the clamping force of the processed object tightly clamped by the pivotal rods. The method comprises the following steps.

1. The spacing between the pivotal rods is first set to be commensurate with the longitudinal length of the processed object.
2. The basis component having the pressure detection component is placed between the pivotal rods with the pivotal rods closely leaning against the basis component. Simultaneously, the detection unit is electrically connected to the pressure detection component.
3. The detection unit detects variation of electric properties of the pressure detection component caused by stress strain and then provides electric signal messages.
4. The electric signal messages are exploited to adjust the spacing between the pivotal rods so as to adjust the clamping force of the basis component having the pressure detection component.

The various objects and advantages of the present invention will be more readily understood from the following detailed description when read in conjunction with the appended drawing, in which:

DETAILED DESCRIPTION OF THE PREFERRED EMBODIMENTS

Figure 1:
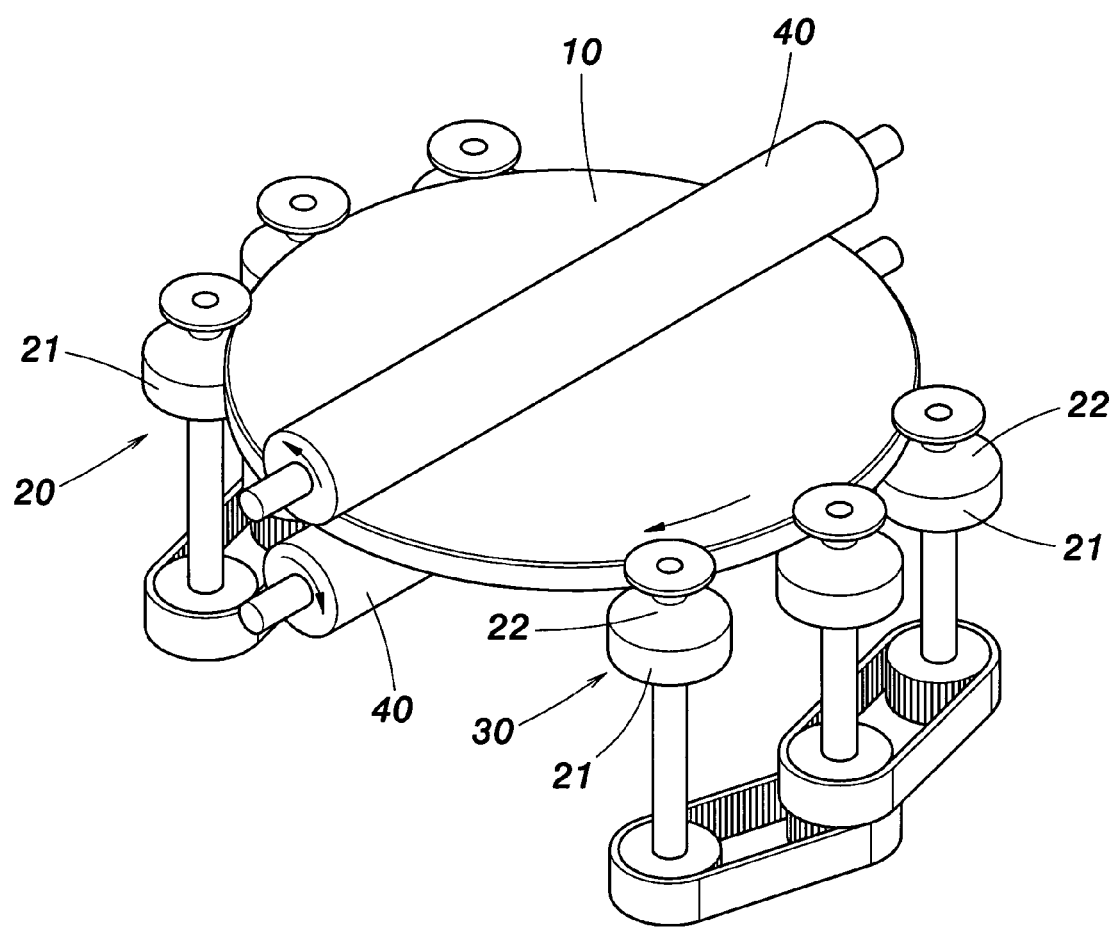
FIG. 1 is a perspective assembly view of a conventional wafer cleaning apparatus for cleaning a processed object.
Figure 2:
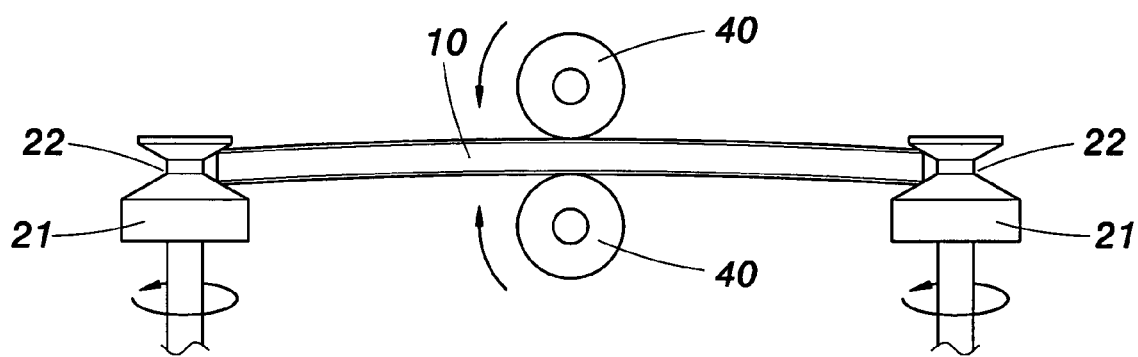
FIG. 2 is a side view of a conventional wafer cleaning apparatus for cleaning a processed object.
Figure 3:
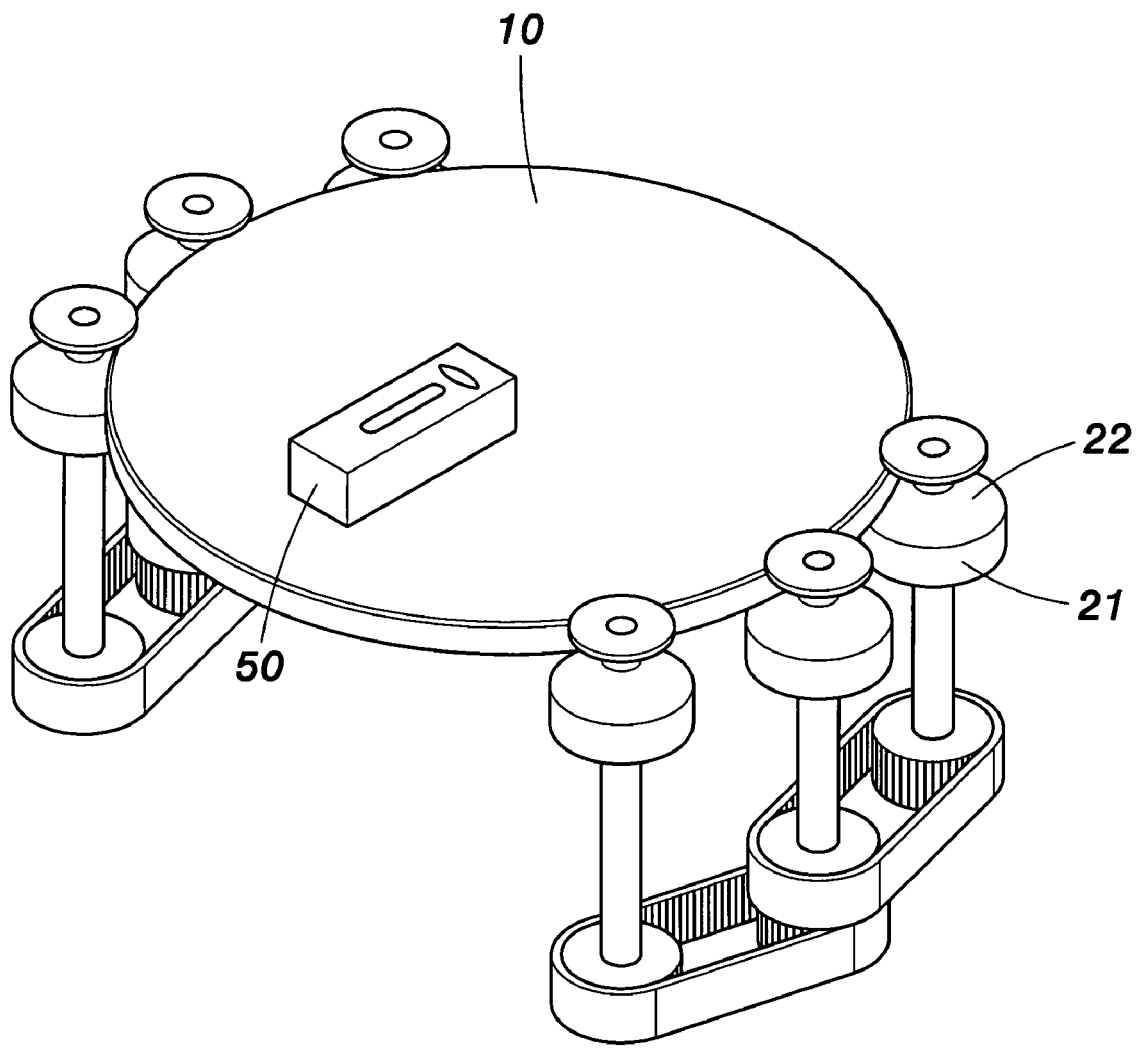
FIG. 3 is a diagram showing a conventional device used for adjusting the clamping force of a processed object and a method thereof.
Figure 4:
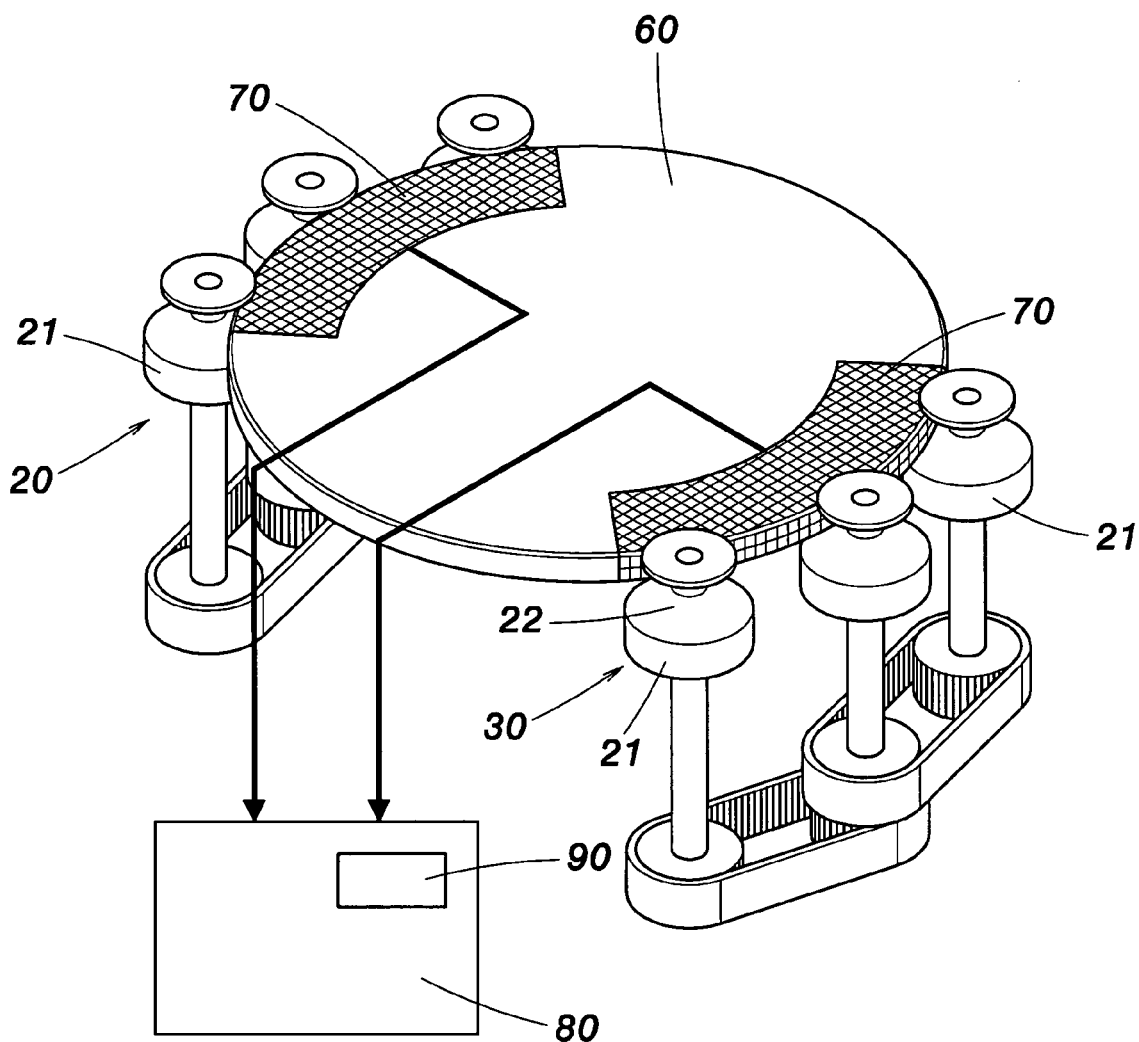
FIG. 4 is a perspective assembly view of a device used for detecting the clamping force of a processed object and a method thereof according to a first embodiment of the present invention.

As shown in FIG. 4, the present invention provides a device used for detecting the clamping force of a processed object and a method thereof. The device detects the clamping force of a processed object 10 clamped by several pivotal rods 21. The device comprises a basis component 60, a pressure, detection component 70 disposed on the basis component 60 and a detection unit 80. The pressure detection component 70 is electrically connected to the detection unit 80. A display unit 90 electrically connected to the detection unit 80 is also provided. The basis component 60 having the pressure detection component 70 closely leans against and is placed between the pivotal rods 21 of the first and second pivotal rod sets 20 and 30 of a wafer cleaning apparatus. The pressure detection component 70 strains due to stress to generate variation of electric properties. The detection unit 80 detects the variation of electric properties of the pressure detection component 70, and the display unit 90 displays a value or an icon to show the clamping force in analog or digital way.

As shown in FIG. 4, the processed object 10 is a wafer or another object. The wafer cleaning apparatus is used to clean the surface of the processed object 10. Annular grooves 22 are disposed at end portions of the pivotal rods 21 of the first and second pivotal rod sets 20 and 30 of the wafer cleaning apparatus so that the basis component 60 having the pressure detection component 70 can lean against between the pivotal rod sets 20 and 30. Moreover, two sides of the pressure detection component 70 are locked between the annular grooves 22 of the two pivotal rods 21, and the side face of the pressure detection component 70 abuts against walls of the annular grooves 22.

As shown in FIG. 4, the basis component 60 can be made of silicon or another material. The pressure detection component 70 is disposed near the pivotal rods 21 and at two sides of the basis component 60. The basis component 60 having the pressure detection component 70 is placed between and leans against the pivotal rods 21. The pressure detection component 70 strains due to stress to generate variation of electric properties. The detection nit 80 detects the variation of electric properties of the pressure detection component 70 and generates electric signal messages. The display unit 90 is used to display the electric signal messages to show the force of the pivotal rods 21 for tightly clamping the basis component 60 having the pressure detection component 70. The spacing between the pivotal rod sets 20 and 30 can thus be adjusted to adjust the clamping force.

Figure 5:
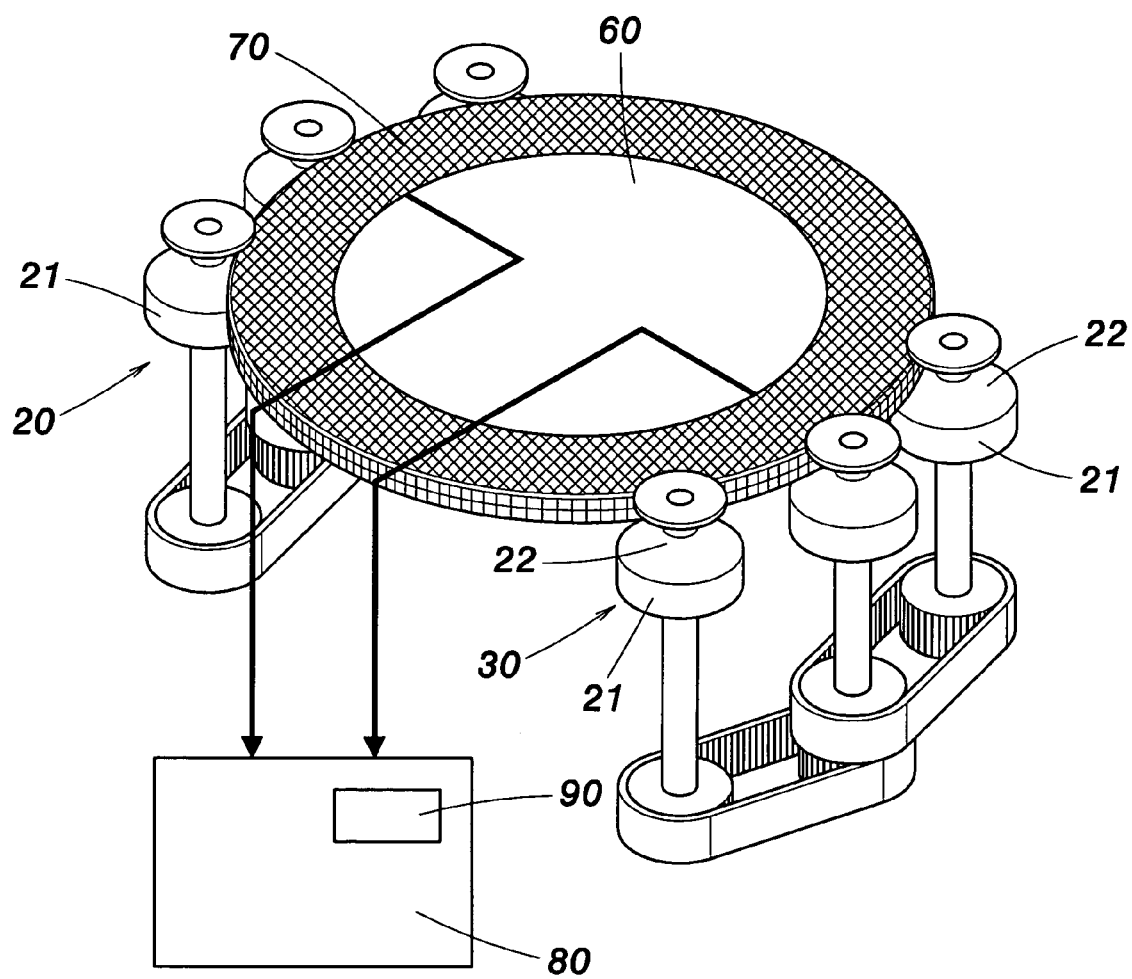
FIG. 5 is a perspective assembly view of a device used for detecting the clamping force of a processed object and a method thereof according to a second embodiment of the present invention.
Figure 6:
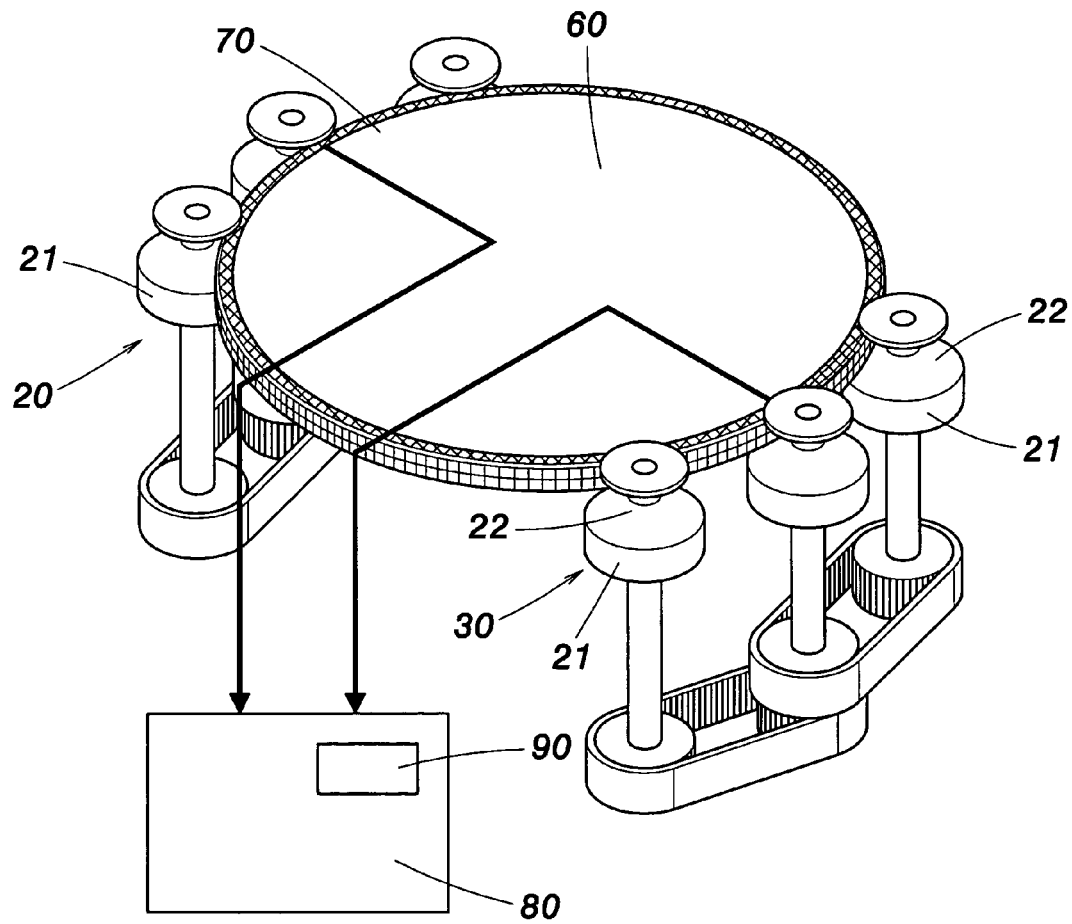
FIG. 6 is a perspective assembly view of a device used for detecting the clamping force of a processed object and a method thereof according to a third embodiment of the present invention.
Figure 7:
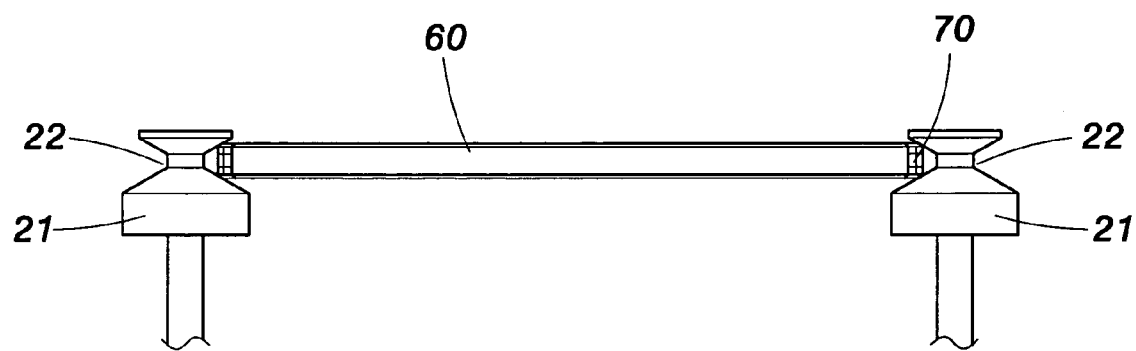
FIG. 7 is a side view of a device used for detecting the clamping force of a processed object and a method thereof according to the third embodiment of the present invention.
Figure 8:
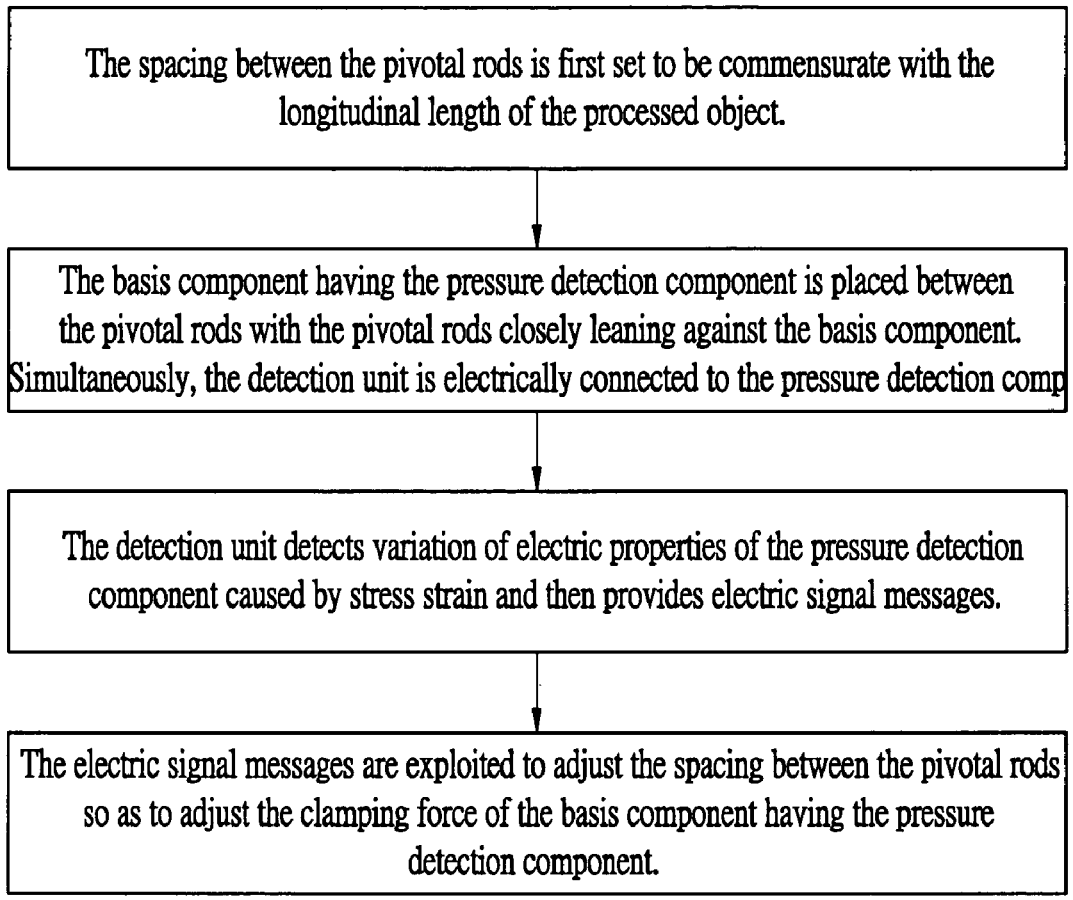
FIG. 8 is a flowchart of a method used for detecting the clamping force of a processed object of the present invention.

As shown in FIG. 5, the pressure detection component 70 can be ring-shaped and disposed on the basis component 60, and contacts the pivotal rods 21. As shown in FIG. 7, the pressure detection component 70 can also be of a membranous shape and disposed at the side face of the basis component 60, and abuts against the pivotal rods 21.

The pressure detection component 70 can be made of piezoelectric material, which is tightly clamped by the pivotal rods 21 to strain due to stress. The magnitude of the strain of the piezoelectric material is utilized to generate a corresponding electric potential difference detected by the detection unit 80. The detection unit 80 then generates electric signal messages displayed by the display unit 90. The piezoelectric material can be quartz, PbZrTiO3, BaTiO3 or ZnO. The pressure detection component 70 can also be made of piezo-resistive material, which is tightly clamped by the pivotal rods 21 to strain due to stress. The magnitude of the strain of the piezo-resistive material is utilized to generate a corresponding resistance variation detected by the detection unit 80. The detection unit 80 then generates electric signal messages displayed by the display unit 90. The display unit 90 can be lamps, a digital display or an analog indicator.

As shown in FIGS. 4 to 8, the present invention also provides a method for detecting the clamping force of a processed object. The method detects the force of the pivotal rods 21 for tightly clamping the processed object 10. The method comprises the following steps.

1. The spacing between the pivotal rods 21 is first set to be commensurate with the longitudinal length of the processed object 10.
2. The basis component 60 having the pressure detection component 70 is placed between the pivotal rods 21 with the pivotal rods 21 closely leaning against the basis component 60. Simultaneously, the detection unit 80 is electrically connected to the pressure detection component 70.
3. The detection unit 80 detects variation of electric properties of the pressure detection component 70 caused by stress strain and then provides electric signal messages.
4. The electric signal messages are exploited to adjust the spacing between the pivotal rods 21 so as to adjust the clamping force of the basis component 60 having the pressure detection component 70.

Therefore, the device used for detecting the clamping force of a processed object and the method thereof can be utilized to detect the clamping force of the processed object 10 of a wafer cleaning and processing apparatus, thereby adjusting the spacing between the pivotal rods to adjust the clamping force.

To sum up, the device used for detecting the clamping force of a processed object and the method thereof of the present invention have the following advantages.

1. Through a quantified value or an icon provided by the device used for detecting the clamping force of a processed object, the clamping force of the processed object can be easily detected, hence facilitating adjustment of the spacing between the pivotal rods.
2. The clamping force of the processed object can be detected and displayed. Moreover, and the clamping force can be quantified.
3. A too large or too small clamping force of the processed object can be avoided.
4. Loss of product and damage of equipment can be avoided.
5. The clamping force of the processed object can be detected to standardize the step of adjusting the spacing between the pivotal rods without the need of teach-and-learn of techniques or experiences.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A method used for detecting the clamping force of a processed object, said method detecting the clamping force of a processed object tightly clamped between several pivotal rods, said method comprises the steps of:
   (a) setting the spacing between said pivotal rods to be commensurate with a longitudinal length of said processed object;
   (b) placing a basis component having a pressure detection component between said pivotal rods with said pivotal rods closely leaning against said basis component, electrically connecting a detection unit to said pressure detection component;
   (c) detecting variation of electric properties of said pressure detection component caused by stress strain and then providing electric signal messages using said detection unit; and
   (d) utilizing said electric signal messages to adjust the spacing between said pivotal rods so as to adjust the clamping force of said basis component having said pressure detection component.

2. The method used for detecting the clamping force of a processed object as claimed in claim 1, wherein said step (c) further comprises a step of electrically connecting a display unit to said detection unit to display said electric signal messages of said detection unit.

3. The method used for detecting the clamping force of a processed object as claimed in claim 2, wherein said display unit can be lamps, a digital display or an analog indicator.

4. The method used for detecting the clamping force of a processed object as claimed in claim 1, wherein said pressure detection component is made of piezoelectric material and disposed on said basis component, and said detection unit detects an electric potential difference caused by stress strain of said piezoelectric material.

5. The method used for detecting the clamping force of a processed object as claimed in claim 4, wherein said piezoelectric material is quartz, $PbZrTiO_3$, $BaTiO_3$ or $ZnO$.

6. The method used for detecting the clamping force of a processed object as claimed in claim 1, wherein said pressure detection component is annularly disposed on said basis component, and said pressure detection component contacts said pivotal rods.

7. The method used for detecting the clamping force of a processed object as claimed in claim 1, wherein said pressure detection component is placed near said pivotal rods and at two sides of said basis component, and contacts said pivotal rods.

8. The method used for detecting the clamping force of a processed object as claimed in claim 1, wherein said pressure detection component is made of piezo-resistive material, and said detection unit detects resistance variation caused by stress strain of said piezo-resistive material.

9. The method used for detecting the clamping force of a processed object as claimed in claim 1, wherein said piezo-resistive material is of a membranous shape and disposed at a side face of said basis component.

10. The method used for detecting the clamping force of a processed object as claimed in claim 1, wherein said basis component can be made of silicon material.

11. A device used for detecting the clamping force of a processed object, said device detecting the clamping force of a processed object tightly clamped between several pivotal rods, said device comprising:
    a basis component;
    a pressure detection component disposed on said basis component; and
    a detection unit electrically connected to said pressure detection component to provide electric signal messages;
    whereby said basis component having said pressure detection component is disposed between said pivotal rods to detect the clamping force.

12. The device used for detecting the clamping force of a processed object as claimed in claim 11 further comprising a display unit electrically connected to said detection unit to display said electric signal messages of said detection unit.

13. The device used for detecting the clamping force of a processed object as claimed in claim 12, wherein said display unit can be lamps, a digital display or an analog indicator.

14. The device used for detecting the clamping force of a processed object as claimed in claim 11, wherein said pressure detection component is made of piezoelectric material, and said detection unit detects an electric potential difference caused by stress strain of said piezoelectric material.

15. The device used for detecting the clamping force of a processed object as claimed in claim 11, wherein said piezoelectric material is of a membranous shape and disposed at a side face of said basis component.

16. The device used for detecting the clamping force of a processed object as claimed in claim 11, wherein said piezoelectric material is quartz, $PbZrTiO_3$, $BaTiO_3$ or $ZnO$.

17. The device used for detecting the clamping force of a processed object as claimed in claim 11, wherein said pressure detection component is annularly disposed on said basis component, and said pressure detection component contacts said pivotal rods.

18. The device used for detecting the clamping force of a processed object as claimed in claim 11, wherein said pressure detection component is placed near said pivotal rods and at two sides of said basis component, and contacts said pivotal rods.

19. The device used for detecting the clamping force of a processed object as claimed in claim 11, wherein said pressure detection component is made of piezo-resistive material, and said detection unit detects resistance variation caused by stress strain of said piezo-resistive material.

20. The device used for detecting the clamping force of a processed object as claimed in claim 19, wherein said piezo-resistive material is of a membranous shape and disposed at a side face of said basis component.

21. The device used for detecting the clamping force of a processed object as claimed in claim 11, wherein said basis component can be made of silicon material.

22. A pressure detection device used for detecting the wafer-clamping force of a wafer cleaning and processing apparatus, said device detecting the clamping force of a wafer tightly clamped between several pivotal rods, said device comprising:
   a basis component;
   a pressure detection component disposed on said basis component; and
   a detection unit electrically connected to said pressure detection component to provide electric signal messages;
   whereby said basis component having said pressure detection component is disposed between said pivotal rods to detect the clamping force.

23. The pressure detection device used for detecting the wafer-clamping force of a wafer cleaning and processing apparatus as claimed in claim 22 further comprising a display unit electrically connected to said detection unit to display said electric signal messages of said detection unit.

24. The pressure detection device used for detecting the wafer-clamping force of a wafer cleaning and processing apparatus as claimed in claim 23, wherein said display unit can be lamps, a digital display or an analog indicator.

25. The pressure detection device used for detecting the wafer-clamping force of a wafer cleaning and processing apparatus as claimed in claim 22, wherein said pressure detection component is made of piezoelectric material, and said detection unit detects an electric potential difference caused by stress strain of said piezoelectric material.

26. The pressure detection device used for detecting the wafer-clamping force of a wafer cleaning and processing apparatus as claimed in claim 25, wherein said piezoelectric material is of a membranous shape and disposed at a side face of said basis component.

27. The pressure detection device used for detecting the wafer-clamping force of a wafer cleaning and processing apparatus as claimed in claim 25, wherein said piezoelectric material is quartz, $PbZrTiO_3$, $BaTiO_3$ or ZnO.

28. The pressure detection device used for detecting the wafer-clamping force of a wafer cleaning and processing apparatus as claimed in claim 22, wherein said pressure detection component is annularly disposed on said basis component, and said pressure detection component contacts said pivotal rods.

29. The pressure detection device used for detecting the wafer-clamping force of a wafer cleaning and processing apparatus as claimed in claim 22, wherein said pressure detection component is placed near said pivotal rods and at two sides of said basis component, and contacts said pivotal rods.

30. The pressure detection device used for detecting the wafer-clamping force of a wafer cleaning and processing apparatus as claimed in claim 22, wherein said pressure detection component is made of piezo-resistive material, and said detection unit detects resistance variation caused by stress strain of said piezo-resistive material.

31. The pressure detection device used for detecting the wafer-clamping force of a wafer cleaning and processing apparatus as claimed in claim 30, wherein said piezo-resistive material is of a membranous shape and disposed at a side face of said basis component.

32. The pressure detection device used for detecting the wafer-clamping force of a wafer cleaning and processing apparatus as claimed in claim 22, wherein said basis component can be made of silicon material.

\* \* \* \* \*